United States Patent [19]

Morkoc

[11] Patent Number: 4,590,502

[45] Date of Patent: May 20, 1986

[54] CAMEL GATE FIELD EFFECT TRANSISTOR DEVICE

[75] Inventor: Hadis Morkoc, Urbana, Ill.

[73] Assignee: University of Illinois, Urbana, Ill.

[21] Appl. No.: 472,691

[22] Filed: Mar. 7, 1983

[51] Int. Cl.$^4$ .................................. H01L 29/80
[52] U.S. Cl. .................................. 357/22; 357/4; 357/16; 357/58; 357/71; 357/65; 357/23.2
[58] Field of Search .............. 357/22, 4, 16, 23.1, 357/23.4, 23.2, 23.12, 58, 65, 71

[56] References Cited

U.S. PATENT DOCUMENTS

| | | | |
|---|---|---|---|
| 3,823,352 | 7/1974 | Pruniaux et al. | 357/22 X |
| 4,075,651 | 2/1978 | James . | |
| 4,424,525 | 1/1984 | Mimura | 357/23.2 |
| 4,455,564 | 6/1984 | Delagebeaudeuf et al. | 357/22 |
| 4,471,367 | 9/1984 | Chen et al. | 357/22 |

OTHER PUBLICATIONS

Mimura et al., "A New Field-Effect Transistor with Selectively Doped GaAs/N-Al$_x$Ga$_{1-x}$As Heterojunctions", *Japanese Journal of Applied Physics*, vol. 19, No. 5, (May, 1980), pp. L225–L227.

Shannon, "A Majority Carrier Camel Diode", *Appl. Phys. Lett.*, vol. 35, pp. 63–65, (Jul. 1979).

*Primary Examiner*—Martin H. Edlow
*Assistant Examiner*—William A. Mintel
*Attorney, Agent, or Firm*—Martin Novack

[57] ABSTRACT

The disclosed device is a field-effect transistor which includes a support region that may typically comprise a substrate having a buffer layer thereon. A semiconductor channel layer of one conductivity type is disposed on the support region. A first highly-doped semiconductor layer of opposite conductivity type is disposed on the channel layer. A second highly-doped semiconductor layer of said one conductivity type is disposed on the first highly-doped semiconductor layer. Source and drain electrodes are disposed in spaced relation, and contact the channel layer. A gate electrode is disposed on the second highly-doped semiconductor layer in the region between the source and drain electrodes. In a preferred embodiment, the source and drain electrodes are disposed on the second highly-doped semiconductor layer and extend through the second and first highly-doped semiconductor layers to the channel layer. The first and second highly-doped layers are thin enough to be fully depleted by adjacent layers. This being the case, it is not necessary to etch these highly-doped layers in the regions between the gate and the source and drain electrodes, since they do not act as current-carrying paths.

7 Claims, 10 Drawing Figures

CAMEL GATE FIELD EFFECT TRANSISTOR DEVICE

This invention was made with Government support under Grant AFOSR-80-0084 awarded by the U.S. Air Force. The Government has certain rights in this invention.

BACKGROUND OF THE INVENTION

This invention relates to field-effect devices and, more particularly, to a "camel gate" FET device and a method of making a camel gate FET device.

Gallium arsenide field-effect transistors for high frequency and large scale integration applications generally employ metal Schottky barrier gates. For high frequency applications, the FETs are designed to operate in the normally-on mode, whereas for LSI applications, normally-off or pseudo-normally-off modes are used. Normally-off or pseudo-normally-off operation is generally achieved by using a very thin channel, which is either depleted or almost depleted by the built-in voltage of the Schottky barrier. The use of a thin channel layer requires that, for good device performance, the buffer layer-channel interface be of high quality. To make the channel conducting and, thus, turn the device on, a forward bias is applied to the gate. The maximum value of this forward bias for satisfactory performance is about 0.6 V. Above this voltage, gate leakage results in a gradual drop in the transconductance and loading of preceding stages.

Unfortunately, there are several problems associated with the use of Schottky barrier gates. Schottky barriers are relatively unreliable, particularly when the operation temperature of the device is high due to either adverse environments or high power dissipation. The metal semiconductor junction presents significant metallurgical difficulties and the built-in junction voltage is difficult to adjust. The maximum forward gate bias of 0.6 V creates several difficulties, including a limitation on the noise margin of the device. In addition, it has been shown that Schottky barriers with acceptable characteristics cannot be obtained on some small bandgap semiconductors, such as indium gallium arsenide, unless a thin tunneling oxide layer is used to enhance the Schottky barrier height. Such an oxide layer naturally introduces additional problems, such as surface states.

It is known that a p/n junction can be used to replace the Schottky gate. This had the advantage of allowing gate voltages of up to 1 V to be applied without any degradation in the transconductance. The associated technology, however, is complicated and the short gate lengths required for high frequency operation are difficult to obtain. Submicron dimensions, though irreproducible and not suitable for LSI, can be obtained using selective etching techniques and by using P (Al,Ga)As in forming the p/n contact. Another disadvantage of this technique is that it requires a metal contact be made to a p-type semiconductor and, consequently, suffers from large gate resistances.

Rectification in the I-V characteristic of an $n^+-n^-$ structure has been obtained when a very thin $p^+$ region is introduced between the $n^+$ and $n^-$ layers (see J. M. Shannon, "A Majority Carrier Camel Diode", Appl. Phys. Lett., Vol. 35, pp. 63-65 (1979). This structure is now known as the "camel diode." Variations of this structure utilizing the advantages of MBE have also been fabricated and shown to have rectifying characteristics. It has also been shown that under forward bias these structures operate as majority carrier devices, not as minority carrier devices as in conventional p-n junction diodes.

It is among the objects of the present invention to provide a field effect transistor device and fabrication method which overcomes the stated disadvantages and other disadvantages of prior art devices and methods.

SUMMARY OF THE INVENTION

The device of the present invention is a field-effect transistor which includes a support region that may typically comprise a substrate having a buffer layer thereon. A semiconductor channel layer of one conductivity type is disposed on the support region. A first highly-doped semiconductor layer of opposite conductivity type is disposed on the channel layer. A second highly-doped semiconductor layer of said one conductivity type is disposed on the first highly-doped semiconductor layer. Source and drain electrodes are disposed in spaced relation, and contact the channel layer. A gate electrode is disposed on the second highly-doped semiconductor layer in the region between the source and drain electrodes.

In a preferred embodiment of the invention, the source and drain electrodes are dispoed on the second highly-doped semiconductor layer and extend through the second and first highly-doped semiconductor layers to the channel layer. The first and second highly-doped layers are thin enough to be fully depleted by adjacent layers. This being the case, it is not necessary to etch these highly-doped layers in the regions between the gate and the source and drain electrodes, since they do not act as current-carrying paths.

In a form of the invention, the channel layer and the second highly-doped layer are formed of n-type gallium arsenide, and the first highly-doped layer is p-type gallium arsenide or aluminum gallium arsenide. The highly-doped semiconductor layers preferably have at least $10^{18}$ carriers per cubic centimeter.

In accordance with an embodiment of the method for making the field-effect transistor hereof, the described channel layer and first and second highly-doped layers are epitaxially formed on the support region. Spaced metallization contacts are then applied on the second high-doped layer and a portion of each contact is driven through the highly-doped layers to the channel layer to obtain source and drain electrodes. A conductive gate electrode can then be formed between the source and drain electrodes. The driving of a portion of the spaced metallization contacts through the highly-doped layers can be achieved by annealing. Alternately, the step of applying and driving of contacts to obtain source and drain electrodes can be implemented by ion implantation. Accordingly, it will become understood that an advantage of the present device, and the method of making it, is the absence of the need to etch the highly-doped semiconductor layers, since the depletion of carriers from these layers prevents them from shorting out the device.

The device hereof, which can be referred to as a "camel gate FET" has a number of advantages, including the wide range of FET characteristics which may be obtained by varying the dopings and thicknesses of the highly-doped layers. For certain doping-thickness products, large gate-drain breakdown voltages and a relatively voltage-independent transconductance can be achieved, both of these being desirable in large signal applications. Under other conditions, larger transconductances, desirable in logic applications, can be obtained. Ultimate improvement in reliability, as compared, for example, to MESFETs, is also expected.

Further features and advantages of the invention will become more readily apparent from the following detailed description when taken in conjunction with the accompanying drawings.

DESCRIPTION OF THE PREFERRED EMBODIMENTS

Figure 1:
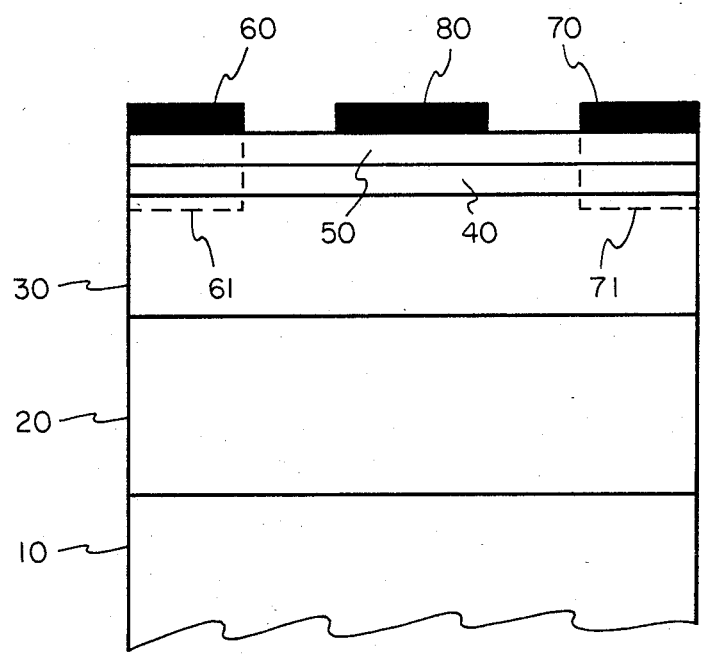
FIG. 1 is a cross-sectional view of a field effect transistor device in accordance with an embodiment of the invention, and which can be fabricated in accordance with the method of the invention.

Referring to FIG. 1, there is shown a cross-sectional view of a field effect transistor device in accordance with an embodiment of the invention. A supporting region includes a semi-insulating gallium arsenide substrate 10 having a gallium arsenide or aluminum gallium arsenide buffer layer 20 thereon. The layer 20 has an n-type gallium arsenide channel layer 30 disposed thereon. A p+ gallium arsenide or aluminum gallium arsenide layer 40 is disposed on the layer 30, and an n+ gallium arsenide layer 50 is disposed on the layer 40. For given doping levels of the n and n+ layers 30 and 50, respectively, the p+ layer 40 preferably has a thickness that is sufficiently small to cause it to be fully depleted in equilibrium. A metal source electrode 60 and a metal drain electrode 70 are each disposed on layer 50, and each extends down through the layers 50 and 40 to contact the channel layer 30, as represented in dashed line at 61 and 71. A metal gate electrode 80 is disposed on the layer 50.

Figure 2:
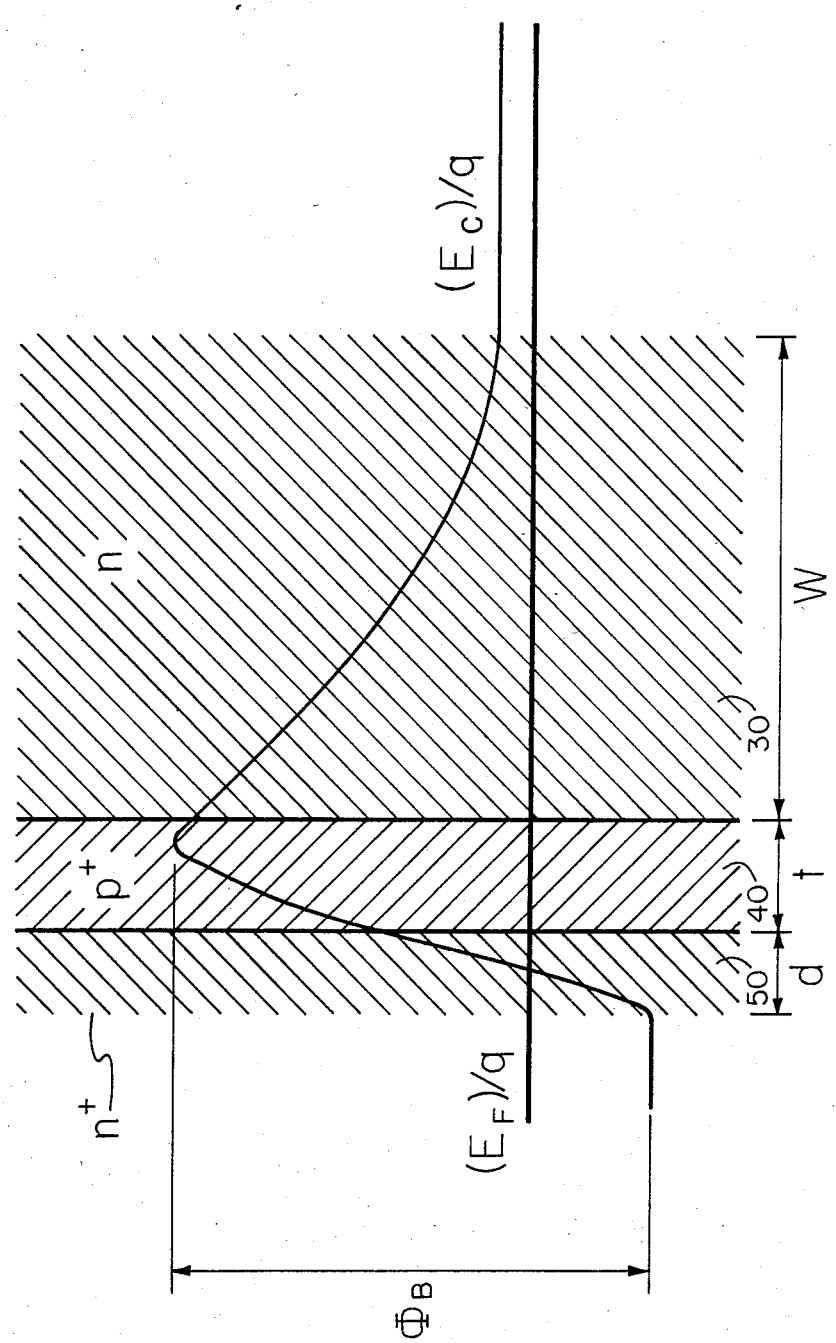
FIG. 2 is a conduction band edge diagram of the device of FIG. 1.

The conduction band edge diagram of the device of FIG. 1 is illustrated in FIG. 2.

The device parameters can be designated as follows: $N_d^+$, $N_a$, and $N_d$ are the doping levels of the n+ layer 50, the p+ layer 40, and the n channel layer 30, respectively; t is the thickness of layer 40, d is the depletion depth into the layer 50 and W is the depletion depth into layer 30; $\phi_B$ is the barrier height to current conduction via thermionic emission; and $V_{n1}$ and $V_{n2}$ are positions of the Fermi level relative to the conduction band edge in the channel 30 and the layer 50, respectively.

The channel depletion depth w satisfies $$aW^2 + \beta W + \gamma = 0$$

where $$\alpha = \frac{q}{2\epsilon_1} N_d \left(1 - \frac{N_d}{N_d^+}\right)$$

$$\beta = \frac{qN_d t}{\epsilon_2}\left(1 + \frac{\epsilon_2}{\epsilon_1} \frac{N_a}{N_d^+}\right)$$

$$\gamma = V_{n2} - V_{n1} + V_a - \frac{qN_a t^2}{2\epsilon_2}\left(1 + \frac{\epsilon_2}{\epsilon_1} \frac{N_a}{N_d^+}\right)$$

and q is the electronic charge, $\epsilon_1$ is the dielectric constant of the layers 30 and 50, $\epsilon_2$ the dielectric constant of the layer 40, and $V_a$ is the forward gate bias. The gate depletion capacitance $C_{gs}$, saturated velocity intrinsic transconductance $g_m$, barrier height $\phi_B$, and depletion depth d are given respectively by $$C_{gs} = \frac{A}{\frac{t}{\epsilon_2}\left(1 + \frac{\epsilon_2}{\epsilon_1} \frac{N_a}{N_d^+}\right) + \frac{W}{\epsilon_1}\left(1 - \frac{N_d}{N_d^+}\right)}$$

$$g_m = \frac{v_s Z}{\frac{t}{\epsilon_2}\left(1 + \frac{\epsilon_2}{\epsilon_1} \frac{N_a}{N_d^+}\right) + \frac{W}{\epsilon_1}\left(1 - \frac{N_d}{N_d^+}\right)}$$

$$\phi_B = \frac{qN_a}{2\epsilon_2}\left(t - \frac{WN_d}{N_a}\right)^2 + \frac{qN_d^+}{2\epsilon_1}\left[\frac{N_a}{N_d^+}\left(t - \frac{WN_d}{N_a}\right)\right]^2.$$

and $$d = t\frac{N_a}{N_d^+} - W\frac{N_d}{N_d^+}$$

where A is the effective gate area, Z the effective gate width (but still the longer dimension), $v_s$ the electron saturation velocity, and $\Delta E_c$ the conduction band edge discontinuity at the p+-channel layer interface. In the following, the values of the FET parameters used in the calculations were $N_d^+ = 7 \times 10^{18}$ cm$^{-3}$, $N_d = 2 \times 10^{17}$ cm$^{-3}$, and t=100 Angstroms, which are typical of actual devices. Since the doping-thickness product of the p+ layer 40 is most important in determining the performance of the device, the calculations were made for three different values of the p+ layer doping $N_a$: $4 \times 10^{18}$, $7 \times 10^{18}$ and $1 \times 10^{19}$ cm$^{-3}$. The p-layer semiconductor was assumed to be GaAs.

Figure 3:
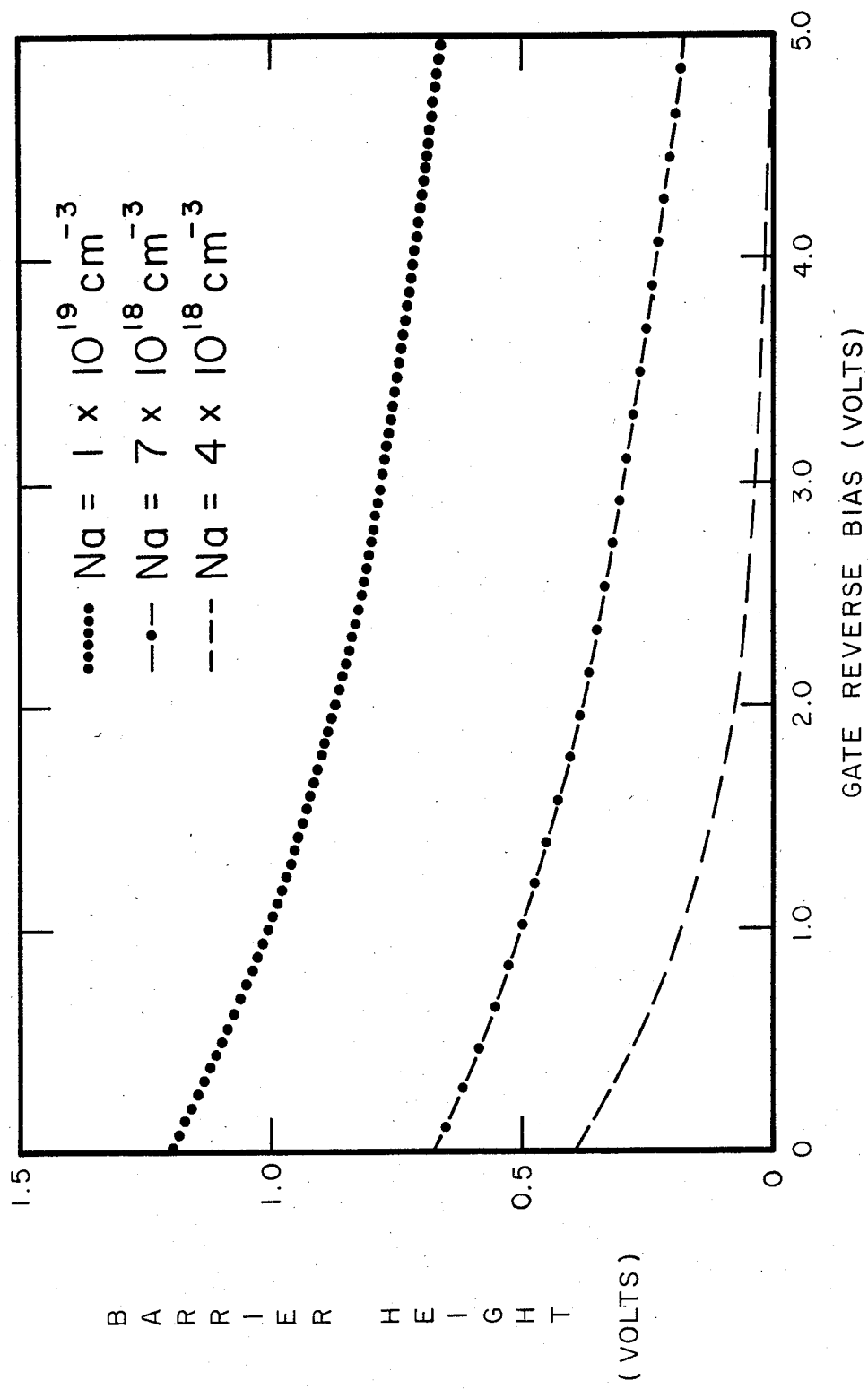
FIG. 3 shows barrier height as a function of gate reverse bias for different doping levels of the highly doped p-type layer.

FIG. 3 shows the barrier height $\phi_B$ as a function of gate reverse bias (i.e., gate negative with respect to the source). The barrier height is very sensitive to the p+ doping level $N_a$, varying from a zero bias value of 1.2 V for $N_a = 1 \times 10^{19}$ cm$^{-3}$ down to 0.3 V for $N_a = 4 \times 10^{18}$ cm$^{-3}$. The barrier height may be increased by increasing the thickness and doping of the p+ layer 40 and decreasing the dopings of the n+ and channel layers 50 and 30, respectively. In theory, the maximum barrier height possible is the semiconductor bandgap, the limit arising due to tunneling of electrons from the valence band in the p-layer to the conduction band of the n+ layer. A larger bandgap material, such as (Al,Ga)As may be used to enhance the barrier height, although this has little effect on the potential depleting the channel.

An interesting feature of the barrier height in the present "camel gate" FET is that it has a much stronger dependence on the gate voltage than does that of a Schottky barrier device. Indeed, if the p+ layer 40 is lightly doped, the barrier height may be reduced to near zero with the application of a small reverse bias, leading to heavy gate conduction. By choosing the structural parameters properly, however, large barrier heights may be maintained for reverse gate biases in excess of 30 V.

Figure 4:
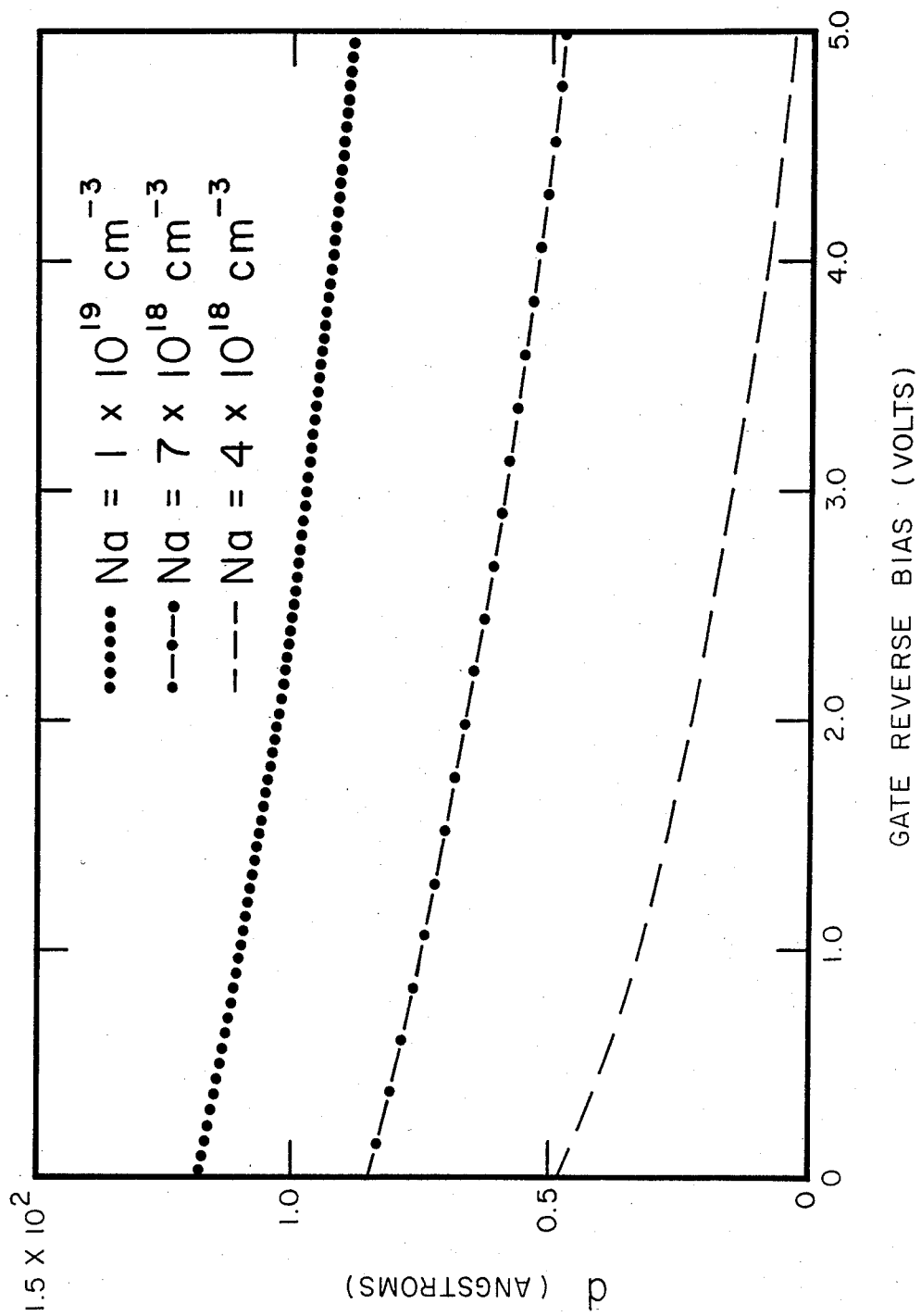
FIG. 4 shows the relation between depletion depth into the highly doped n-type layer and the gate bias, for different doping levels of the highly doped p-type layer.

FIG. 4 gives the relation between d, the depletion depth into the n+ layer, and the gate bias. The decrease in depletion depth with increasing reverse bias is a consequence of charge conservation. The sum of the charges in the n+ and channel depletion layers is equal to the charge in the p+ layer. Consequently, under reverse bias, an increase in the charge in the channel depletion layer must be accompanied by a corresponding decrease in that of the n+ depletion layer. The depletion depth for $N_a = 1 \times 10^{19}$ cm$^{-3}$ is about 100 Angstroms. For $N_d+ = 7 \times 10^{18}$ cm$^{-3}$, surface states will deplete about another 120 Angstroms, so that provided the n+ layer thickness is less than about 200 Angstroms, it will be fully depleted. As seen herein, this fact can greatly simplify the fabrication of the FET.

Figure 5:
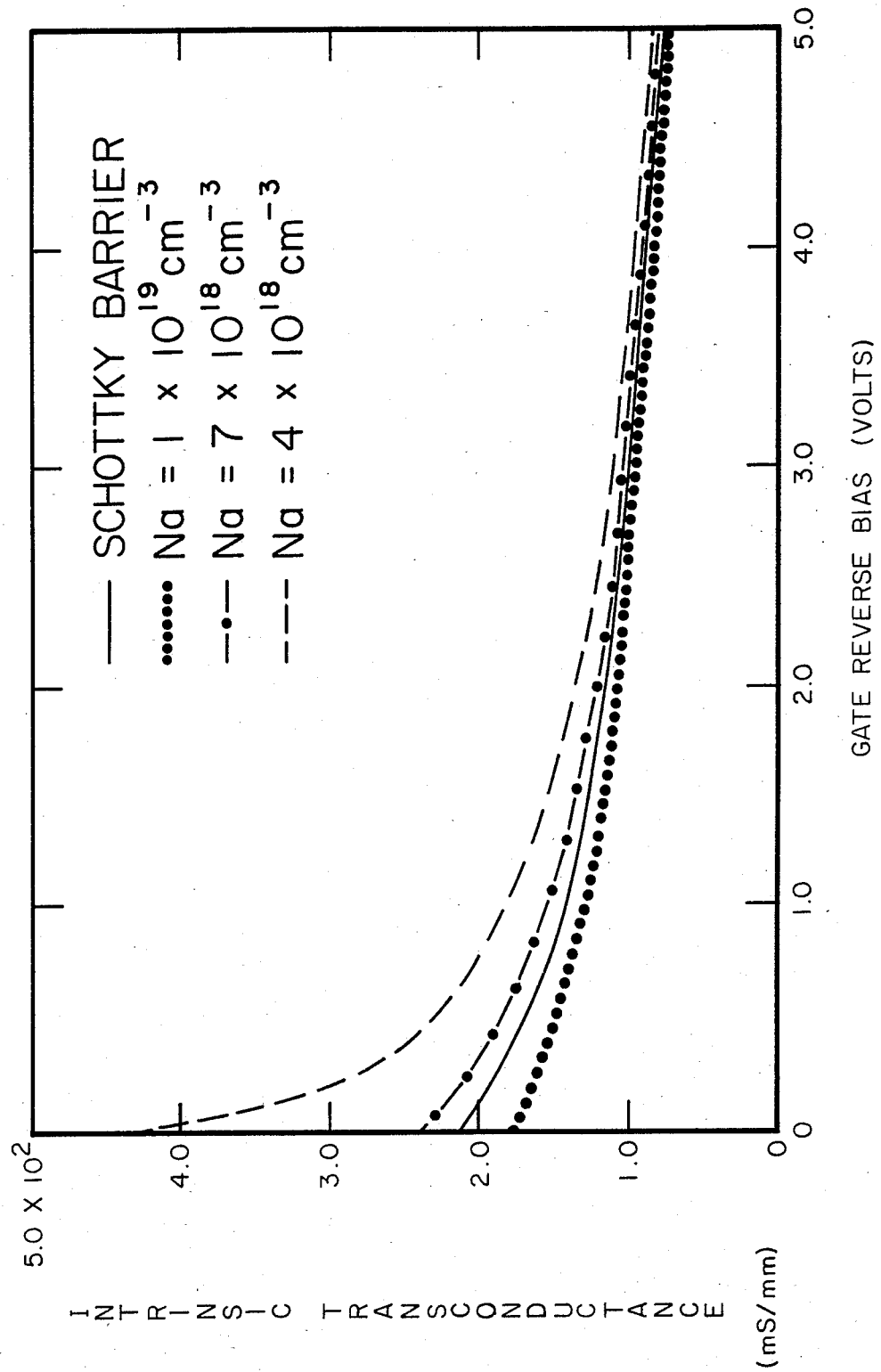
FIG. 5 illustrates the intrinsic transconductance of the device operating in the saturated velocity limit.

The intrinsic transconductance, $g_m$, of the present device operating in the saturated velocity limit is illustrated in FIG. 5. The saturation velocity was assumed to be $1.4 \times 10^7$ cm/s. Again, the corresponding $g_m$ for a MESFET with a 0.8 V barrier height is also indicated. By choosing a small p+ doping, $N_a$, a large $g_m$ can be obtained. Conversely, a large $N_a$ yields a small $g_m$. It can also be noted that for large $N_a$, $g_m$ shows a relatively small variation with gate bias. Such a device should yield reduced third harmonic distortion and perform well as a linear amplifier.

Figure 6:
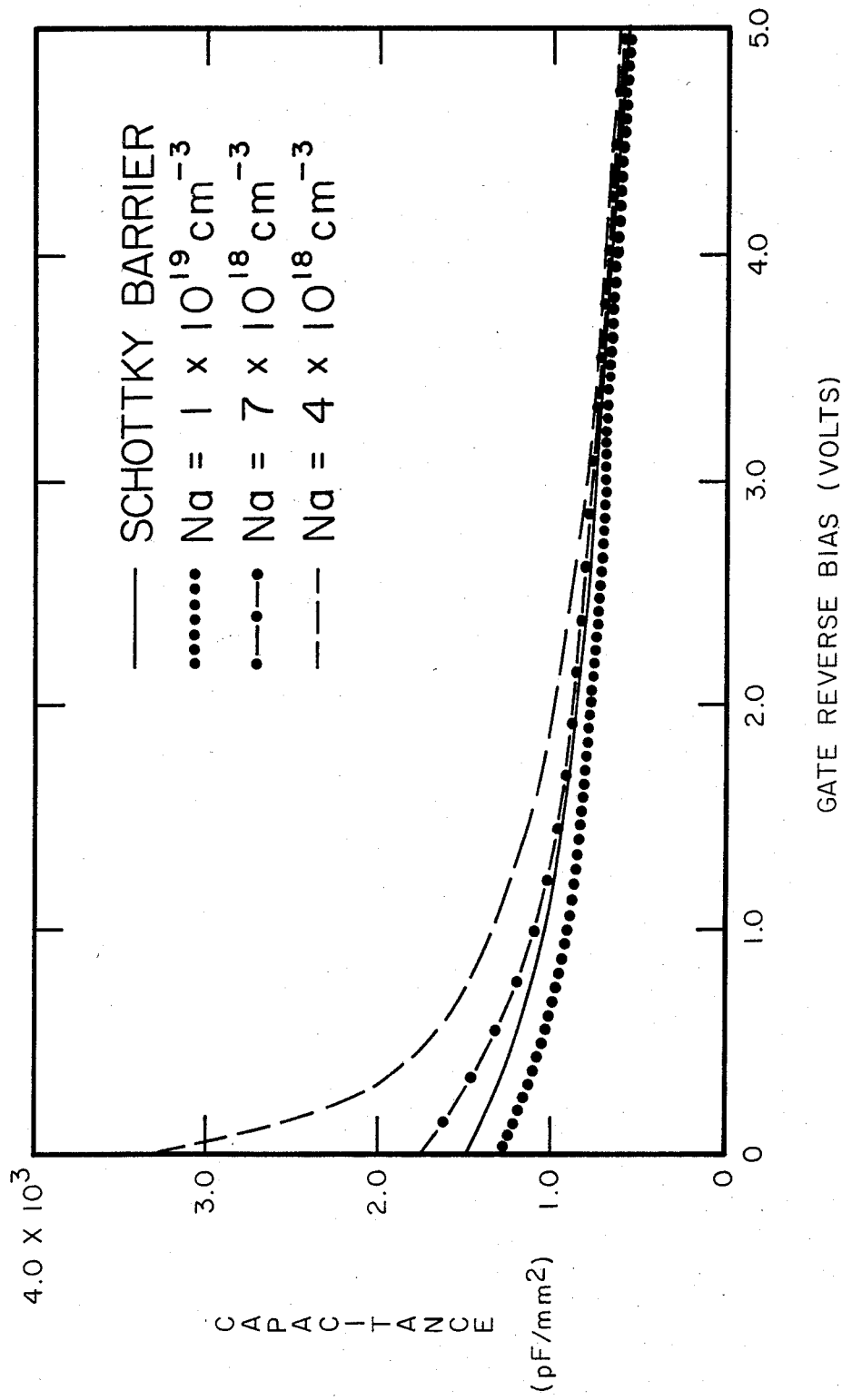
FIG. 6 illustrates gate capacitance as a function of gate reverse bias, for different values of the doping level of the highly doped p-type layer.

The high frequency performance of a field-effect transistor depends not only on the transconductance, but also on the gate capacitance $C_{gs}$, which is illustrated in FIG. 6. It should be noted that, for short channel devices, the ratio $g_m/C_{gs}$ depends only on geometrical factors and material parameters, and not on the structure of the layers. Consequently, the high frequency performance of the present camel gate FETs is expected to be similar to that of the MESFETs.

Exemplary devices in the form of FIG. 1 were fabricated on a Cr-doped gallium arsenide semi-insulating substrate (10). The following layers were grown by molecular beam epitaxy: A 1 micron thick high-resistivity $Al_{0.3}Ga_{0.7}As$ buffer layer (20); a 0.2 micron thick gallium arsenide layer (30) doped with silicon to a level of about $1.7 \times 10^{17}$ cm$^{-3}$; a 100 Angstrom p+ layer of gallium arsenide (40) doped with Be to a level of about $10^{19}$ cm$^{-3}$; and a 200 Angstrom n+ layer of gallium arsenide (50) doped with Sn to a level of about $10^{19}$ cm$^{-3}$. FETs were then fabricated by first etching mesas and photolithographically defining the source and drain patterns. A Au/Ge/Ni/Au source and drain metallization was evaporated and lifted off. Alloying of the metallization into the FET channel 30 was then performed at 400° C. for one minute in an H$_2$ atmosphere. This procedure yielded contacts (60 and 70) with specific contact resistivities in the low $10^{-6}$ $\Omega$cm$^2$ range. The gate (80) patterns were then defined and a Au gate metallization evaporated and lifted off. Alloying of the gate metal was not necessary because of the heavy doping of the n+ GaAs layer. That the contacts were ohmic was verified experimentally, with good contacts being obtained for n+ dopings as low as $4 \times 10^{18}$ cm$^{-3}$. The completed devices had a 3 $\mu$m source drain spacing, a 1 $\mu$m gate length, and a 145 $\mu$m gate width.

In this example no etching, other than the mesa etch, is required in the fabrication of the device. In particular, etching of the n+ and p+ layers is not necessary because, for sufficiently thin layers, both the n+ and p+ layers are fully depleted and thus cannot contribute to conduction between the gate and source and drain.

As above noted, the doping-thickness product of the p+ layer is important in determining the properties of the device. Several devices were grown with varying p+ dopings and with the rest of the parameters similar. The parameters chosen were nominally $N_d+ = 6 \times 10^{18}$ cm$^{-3}$, $N_d = 8 \times 10^{16}$ to $2 \times 10^{17}$, t = 100 Angstroms and the n+ layer thickness was 200 Angstroms. The p+ doping was varied between $5 \times 10^{17}$ cm$^{-3}$ and $2 \times 10^{19}$ cm$^{-3}$.

Figure 7:
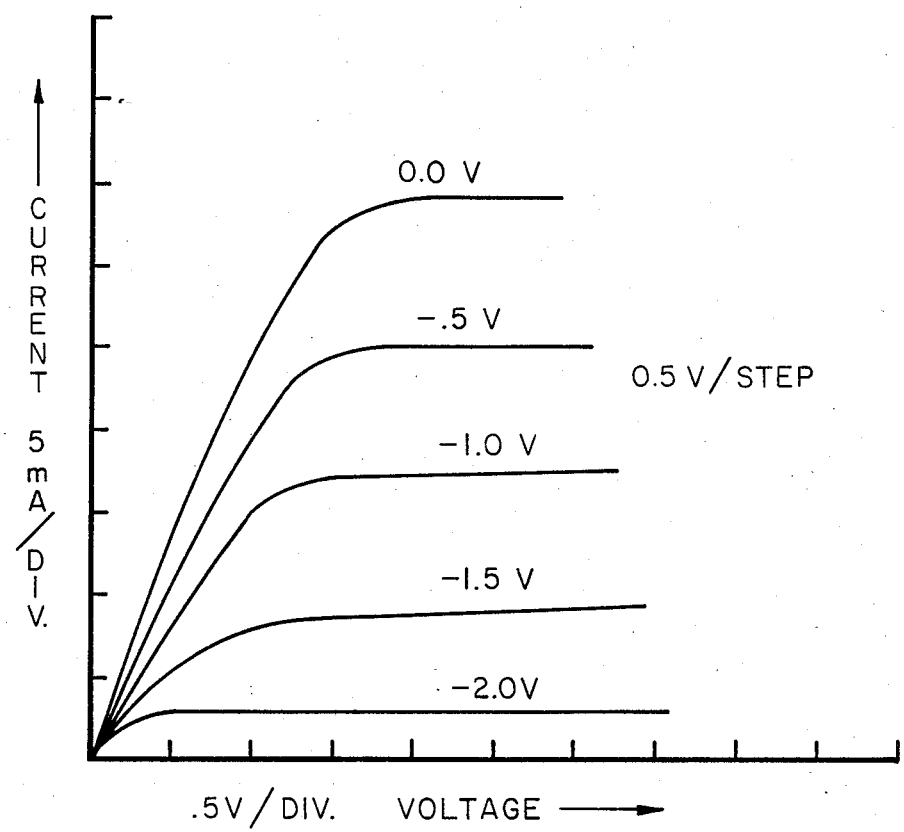
FIG. 7 illustrates drain I-V characteristic of the device for certain doping values for the highly-doped layers.
Figure 8:
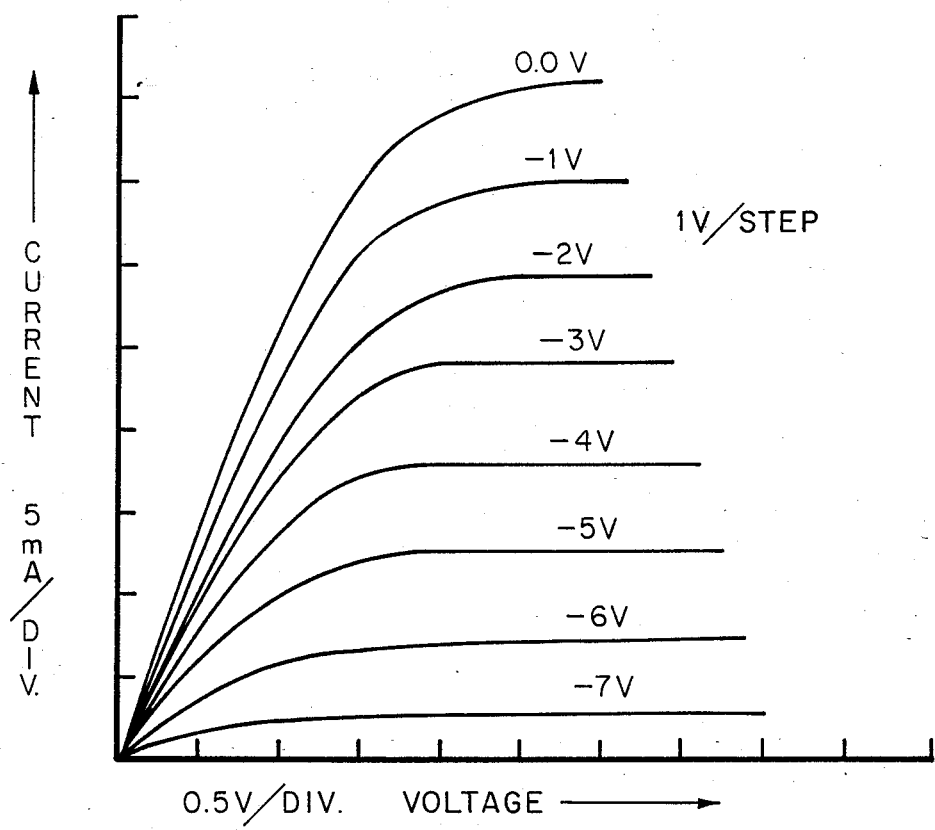
FIG. 8 illustrates drain I-V characteristic of the device for other doping levels of the highly-doped layers.

FIG. 7 shows the drain I-V characteristic of the device with $N_a = 3.5 \times 10^{18}$ cm$^{-3}$ and $N_d = 8 \times 10^{16}$ cm$^{-3}$, while FIG. 8 shows the characteristic of a device with $N_a = 6 \times 10^{18}$ and $N_d = 1.5 \times 10^{17}$ cm$^{-3}$. Both devices had $Al_{0.3}Ga_{0.7}As$ p+ layers. The transconductance of the device with the more heavily-doped p-layer is smaller and varies less with gate bias than that of the more lightly doped device. This performance is consistent with the general trend that heavier p+ doping leads to smaller, more uniform transconductances.

The reverse gate-drain breakdown voltage is very sensitive to p+ doping. For heavy p+ dopings, as in the device of FIG. 8, breakdown voltages of up to 30 V were obtained, compared with 10 V for MESFETs of similar geometry. Assuming a uniform channel field, for the given device geometry a 30 V breakdown voltage corresponds to a channel field of 300 kV/cm. This value is comparable to the breakdown voltage of bulk GaAs.

The implications of the experimental results are that for power FETs, for which linear transconductance, large barrier heights, and large breakdown voltages are desirable, the p+ layer should be heavily doped. For logic applications, the speed is related to $g_m/C_{gs}$. Because parasitics can dominate the $C_{gs}$ term, a large $g_m$ and thus a smaller p+ doping is indicated. Logic applications may also require larger barrier heights for compatibility with other circuits, and these may be obtained as well, although at the cost of reduced $g_m$.

Figure 9:
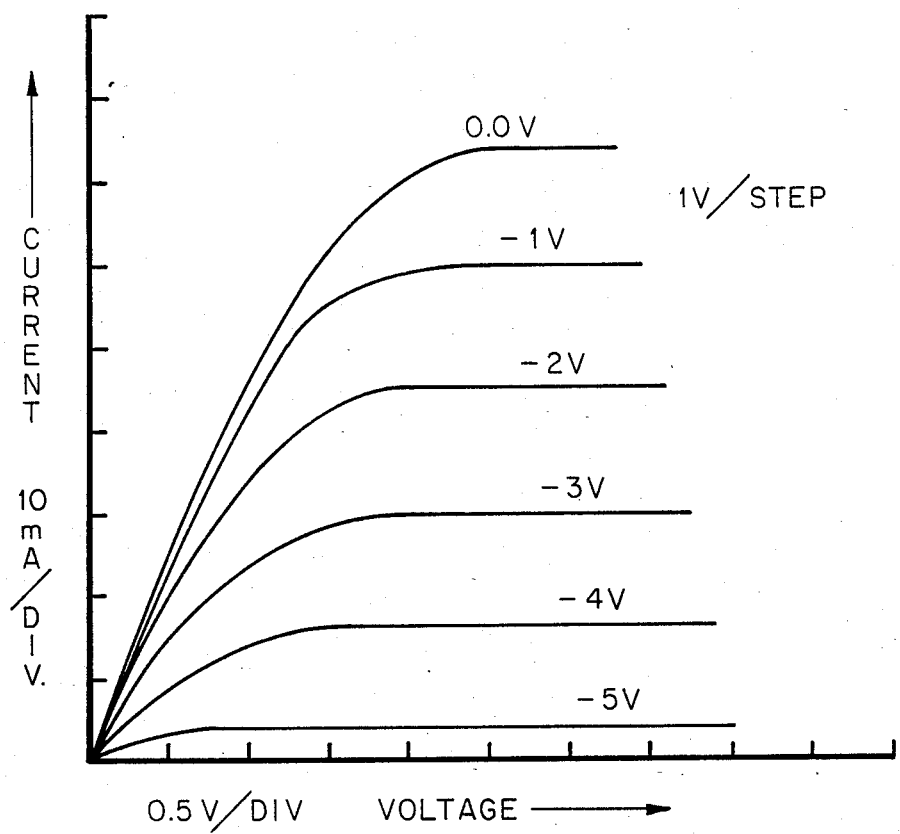
FIG. 9 illustrates drain I-V characteristics for a device having etched portions of the highly-doped layers around the gate electrode.

Although larger p+ doping-thickness products give larger barrier heights and more uniform $g_m$, eventually a product is reached for which the p+ layer is no longer fully depleted. This would result in shorting of the gate to the source and drain, and necessitates etching of the n+ and p+ layers in such devices, which can be done by using the gate metal as a mask. The gate in this case consists of back-to-back diodes. Nevertheless, devices with good characteristics can still be obtained, as indicated by the curves for such a device, as shown in FIG. 9.

Figure 10:
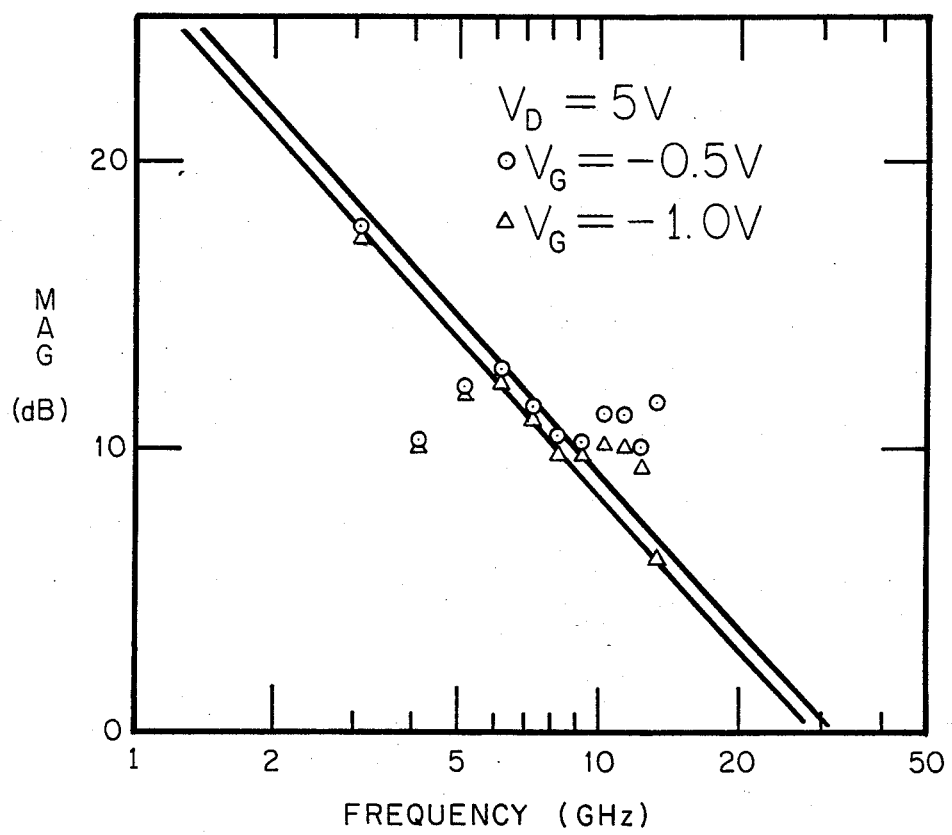
FIG. 10 illustrates measurements of maximum available gain for high frequency input signals.

High frequency performance was determined by making measurements on the device hereof at microwave frequencies. A small amplitude microwave signal was applied to the device gate input, and the maximum available gain (MAG) was measured versus frequency for the device described in conjunction with FIG. 7. The results, for two gate voltages, are plotted in FIG. 10.

I claim:

1. A field-effect transistor device, comprising:
   a support region;
   a semiconductor channel layer of one conductivity type disposed on the support region;
   a first highly-doped semiconductor layer of opposite conductivity type disposed on said channel layer;
   a second highly-doped semiconductor layer of said one conductivity type disposed on said first highly-doped semiconductor layer;
   source and drain electrodes disposed in spaced relation on said second higly-doped semiconductor layer and extending through said second and first highly-doped semiconductor layers to said channel layer; and
   a gate electrode disposed on said second highly-doped semiconductor layer in the region between said source and drain electrodes.

2. The device as defined by claim 1, wherein said first and second highly-doped layers are thin enough to be fully depleted by adjacent layers.

3. The device as defined by claim 1, wherein said one conductivity type is n-type and said opposite conductivity type is p-type.

4. The device as defined by claim 1, wherein said channel layer and said second highly-doped layer are formed of gallium arsenide and said first highly-doped layer is formed of a semiconductor selected from the group consisting of gallium arsenide and aluminum gallium arsenide.

5. The device as defined by claim 4, wherein said highly doped semiconductor layers have at least $10^{18}$ carriers per cubic centimeter.

6. The device as defined by claim 1, wherein said support region comprises a substrate having a high-resistivity semiconductor buffer layer thereon.

7. The device as defined by claim 1, wherein said gate electrode forms an ohmic contact with said second highly-doped semiconductor layer.

* * * * *